United States Patent [19]

Buckley

[11] 3,980,505
[45] Sept. 14, 1976

[54] PROCESS OF MAKING A FILAMENT-TYPE MEMORY SEMICONDUCTOR DEVICE

[76] Inventor: William D. Buckley, 1035 Kirts Road, Troy, Mich. 48084

[22] Filed: May 22, 1975

[21] Appl. No.: 579,821

Related U.S. Application Data

[62] Division of Ser. No. 396,497, Sept. 12, 1973, Pat. No. 3,886,577.

[52] U.S. Cl. .............................. 148/1.5; 148/175; 357/2
[51] Int. Cl.² ...................................... H01L 21/22
[58] Field of Search ............ 148/1.5, 175; 307/324; 357/2

[56] References Cited
UNITED STATES PATENTS

| | | | |
|---|---|---|---|
| 3,271,591 | 9/1966 | Ovshinsky | 357/2 X |
| 3,571,669 | 3/1971 | Fleming | 357/2 |
| 3,571,672 | 3/1971 | Ovshinsky | 357/2 |

*Primary Examiner*—L. Dewayne Rutledge
*Assistant Examiner*—J. M. Davis
*Attorney, Agent, or Firm*—Wallenstein, Spangenberg, Hattis & Strampel

[57] ABSTRACT

An improved memory device to be used in a D.C. circuit which device includes a pair of spaced electrodes between which extends a body of a generally amorphous high resistance memory semiconductor material made of a composition of at least two elements and wherein the application to the electrodes of one or more set voltage pulses in excess of a given threshold level produces a relatively low resistance filamentous path comprising a deposit of at least one of said elements in a crystalline or relatively ordered state. When one or more D.C. current reset pulses of a given value and duration are fed through the filamentous path, the crystalline deposit is returned to a relatively disordered state and the more electropositive element of said composition normally tends to migrate to the negative electrode and the more electronegative element thereof normally tends to migrate to the positive electrode. The improvement is that the amorphous memory semiconductor in the fabrication thereof is provided adjacent substantially the entire surface area thereof facing one of the adjacent electrodes an electrode-memory semiconductor interface region containing a substantially higher concentration of said element which would normally tend to migrate thereto during said reset operation, such electrode-memory semiconductor interface region being sufficiently extensive and having a sufficient concentration of said element to effect a stabilized gradient of said element through the reset region of the semiconductor material in at most a small number of set-reset cycles, so that threshold voltage stabilization is achieved substantially immediately thereafter.

6 Claims, 8 Drawing Figures

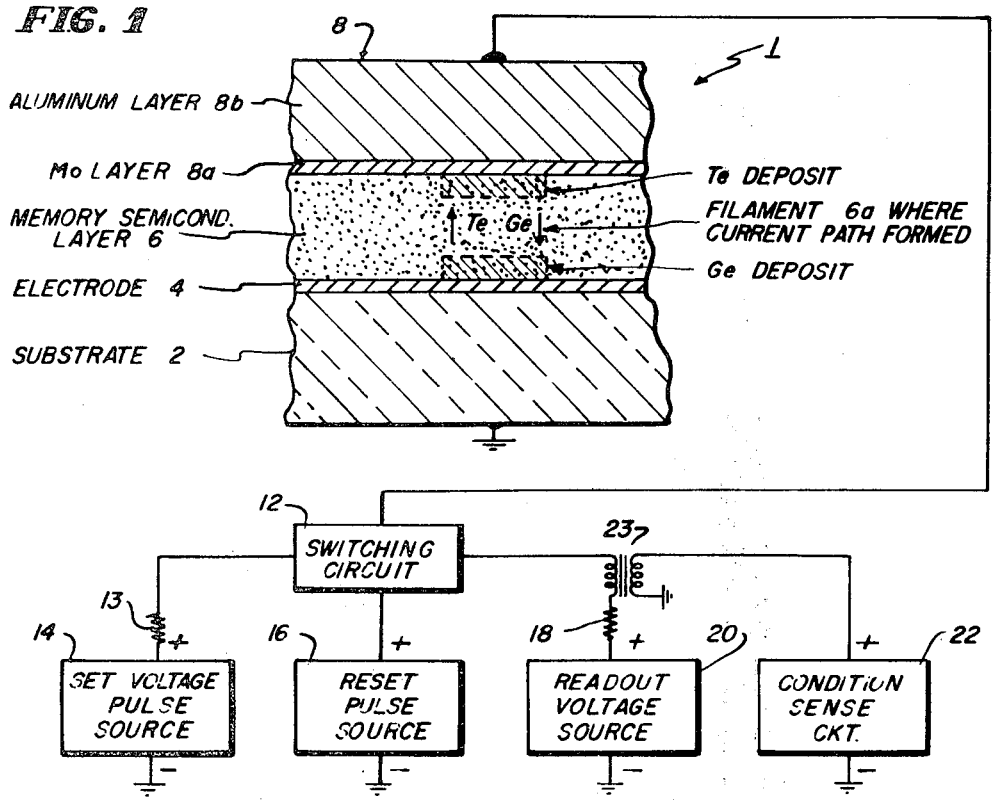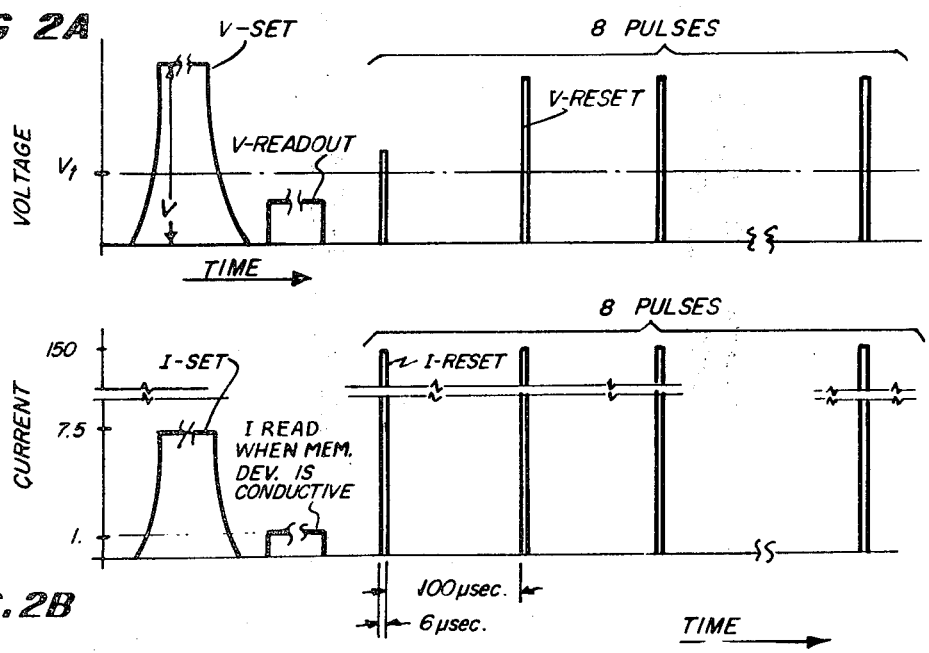

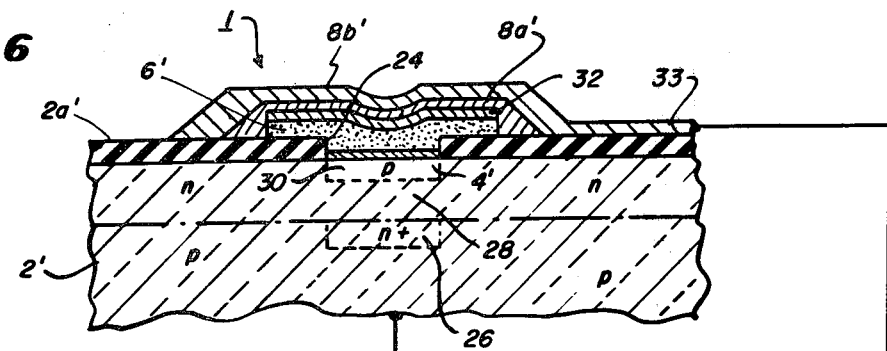
FIG. 6
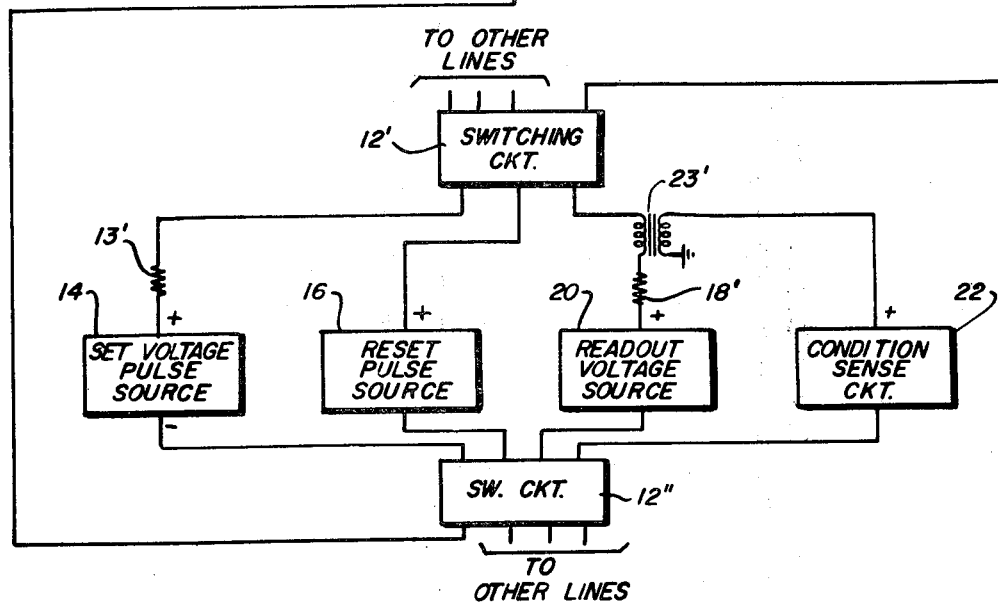
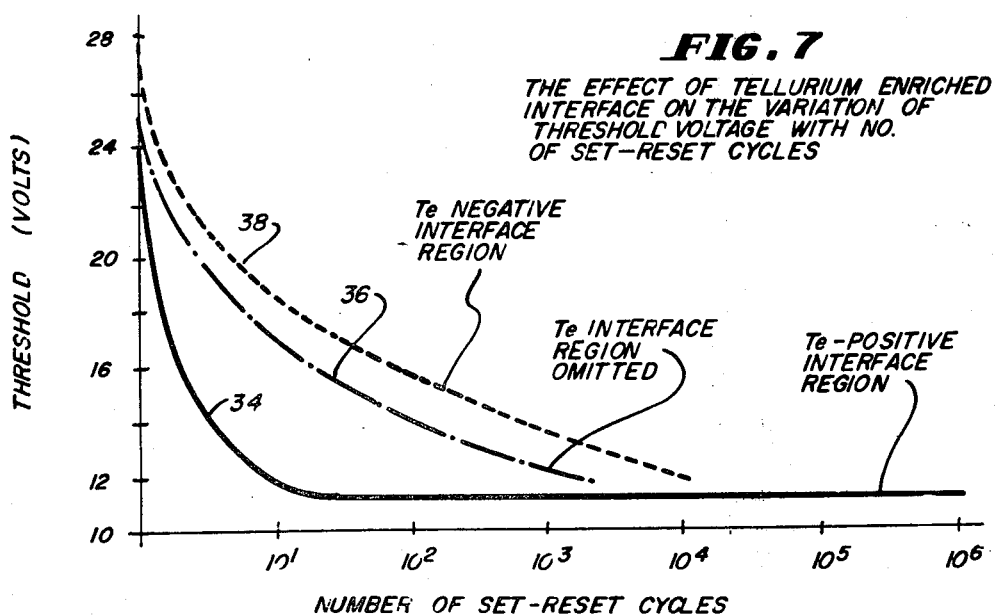
FIG. 7
THE EFFECT OF TELLURIUM ENRICHED INTERFACE ON THE VARIATION OF THRESHOLD VOLTAGE WITH NO. OF SET-RESET CYCLES

PROCESS OF MAKING A FILAMENT-TYPE MEMORY SEMICONDUCTOR DEVICE

The invention herein described was partly made in the course of or under a contract with the Noval Ordinance Laboratory.

RELATED APPLICATION

This application is a division of Application Ser. No. 396,497, filed Sept. 12, 1973 now U.S. Pat. No. 3,886,577.

BACKGROUND OF THE INVENTION

In recent years, there has been developed a memory matrix utilizing the non-volatile resettable characteristic of a memory semiconductor material like those disclosed in U.S. Pat. No. 3,271,591, granted on Sept. 6, 1966 to S. R. Ovshinsky. Such a memory matrix has been integrated onto a silicon semiconductor substrate as disclosed in U.S. Pat. No. 3,699,543, granted Oct. 17, 1972 to Ronald G. Neale. As disclosed in this patent, the entire matrix, other than the read and/or write circuits, is formed within and on a semiconductor substrate, such as a silicon chip, which is doped to form spaced, parallel X or Y axis conductor-forming regions within the body. In "read-write" memory matrices, the substrate is further doped to form isolating diodes or transistor elements for each active cross-over point. The diode or transistor elements have one or more terminals exposed through openings in an outer insulating coating on the substrate. The other Y or X-axis conductors of the matrix are formed by spaced parallel bands of conductive material deposited on the insulation covered semiconductor substrate. The memory matrix further includes a deposited memory device including a film of said memory semiconductor material on the substrate adjacent each active crossover point of the matrix. The film of memory semiconductor material is connected between the associated Y or X-axis band of conductive material in series with the isolating diode or transistor where such an isolating element is present.

The deposited film memory device used in the memory matrix referred to is a two-terminal bistable device including a layer of memory amorphous semiconductor material which is capable of being triggered (set) into a stable low resistance condition when a voltage applied to the spaced portions of this layer exceeds a given threshold voltage and current is allowed to flow for a sufficient duration (e.g. 1-100 milliseconds or more) to cause after termination thereof, by the slow cooling of the resulting bulk heated film, alteration of the portion of the film through which the current flows to a low resistance crystalline or more ordered condition. This condition remains indefinitely, even when the applied voltage and current are removed, until reset to a high resistance condition as by feeding a high current short duration reset current pulse therethrough (e.g. a 150 ma pulse of 10 microseconds). It has been shown that the set current pulse flows only through a small filament of generally under 5-10 microns which is the only portion of the amorphous film converted to a more ordered or crystalline state of low resistance. The rest of the body of memory semiconductor material remains in its initial high resistance amorphous state.

A readout operation on the voltage memory matrix to determine whether a memory device at a selected cross-over point is in a low or high resistance condition involves the feeding of a voltage below the threshold voltage value across the associated X and Y-axis conductors which is insufficient to trigger the memory switch device involved when in a high resistance condition to a low resistance condition and of a polarity to cause current flow in the low impedance direction of the associated isolating element, and detecting the resulting current or voltage condition.

Manifestly, the reliability of memory matrices in which information is stored in computers and the like is of exceeding importance and some marketing limitations have been heretofore experienced because of the threshold reduction of the device in some cases within a relatively few number of cycles of operation of the matrices and in other cases after prolonged use thereof. I discovered that the short term failure of many of these matrices was due to damage to the memory devices at the usually refractory metal electrodes which electrically connected the memory semiconductor material to the X or Y-axis conductors deposited on top of the memory semiconductor films at the cross-over points of the matrix. These X or Y-axis conductors were commonly deposits of aluminum and the electrodes which interface the aluminum conductors with the memory semiconductor material were usually amorphous molybdenum films which, among other things, prevented migration of the aluminum into the memory semiconductor material when the voltage applied to the deposited film X or Y-axis conductors was positive relative to the X or Y-axis conductors integrated into the silicon chip substrate.

It was discovered that with many repeated set-reset cycles, the threshold voltage characteristics of the memory devices progressively degrades. For example, where the thickness of the memory semiconductor film provided a threshold voltage of 14 volts at room temperature (25°C) when the matrix was initially fabricated and subjected to the usual testing where the memory device undergo about twenty to thirty set-reset cycles, upon the subsequent application of hundreds or thousands of additional set cycles, the threshold voltage value can progressively decrease to a point at or below 8 volts. This threshold degradation poses a serious problem when the read voltage exceeds a degraded threshold voltage value, because then the read voltage will set all unset memory devices to which it is applied and thereby destroy the binary information stored in the matrix involved. A typical read-out voltage used with matrices made by Energy Conversion Devices, Inc., the assignee of the present invention, is in the neighborhood of 5 volts, and the set voltage used therewith is in the neighborhood of 25 volts. At first glance, it would not seem that the threshold degradation described would be a serious problem until the threshold voltage values of the films reached 5 volts (or whatever the level of the read voltages may be, considering the tolerances involved). However, a memory device having a given initial threshold voltage at room ambient temperature will have a substantially lower initial threshold voltage at substantially higher ambient temperatures, so that, for example, a memory device having an 8 volt threshold voltage at room temperature can have a threshold voltage of 5 volts at ambient temperatures of 100°C. Threshold degradation can thus be especially serious for equipment to be operated, or having specifications ensuring reliable operation, at high ambient temperatures. (It should be noted also that threshold voltages will increase with decrease in ambient temperature so that a memory semiconductor film thickness is limited by the standardized set voltages used in a given system.) In any event, it is apparent that it is important that the memory devices of the memory matrices referred to have a fairly stabilized threshold voltage for a given reference or room temperature, so that the reliability of the matrix can be assured over a very long useful life span under wide temperature ranges like 0°-100°C.

The features of the present invention are particularly useful in memory semiconductor devices utilizing tellurium based chalcogenide glass materials which have the general formula:

where:
- A=5 to 60 atomic percent
- B=30 to 95 atomic percent
- C=0 to 10 atomic percent when $x$ is antimony (Sb) or Bismuth (Bi)

or
- C=0 to 40 atomic percent when $X$ is arsenic (As)
- D=0 to 10 atomic percent when $Y$ is Sulphur (S)

or
- D=0 to 20 atomic percent when $Y$ is Selenium (Se)

In testing such devices, I discovered that after many tens or hundreds of thousands of set-reset cycles, the threshold voltages level off at plateaus which are proportional to the thickness of the semiconductor film involved. Thus, for example, in the case of the memory material $Ge_{15}Te_{81}Sb_2S_2$, the memory semiconductor film of about 3½ microns in thickness had a stabilized threshold voltage of between 12 and 13 volts at room ambient temperature and the memory semiconductor film of about 2 microns had a stabilized threshold voltage of near about 8 volts at room ambient temperature. It was postulated that this plateau in the curve of threshold voltage versus number of set-reset cycles for the memory semiconductor devices was the result of an equilibrium between the migration during reset current flow through the previously crystalline filament path (which is mainly crystalline tellurium) of the relatively electronegative tellurium to the positive electrode and the electropositive germanium to the negative electrode and mass transport or diffusion of the same in the opposite direction during and upon the termination of the reset current. The reset current substantially reconverts or dissipates the crystalline tellurium filament into an original amorphous condition of tellurium, germanium and any other elements present in the compositions, although some crystallites of tellurium may remain at widely spaced points of the original filament path. Thus, the electromigration causes the relatively electronegative (e.g. tellurium) to build up a permanently crystalline highly conductive deposit at the positive electrode and the relatively electropositive germanium to build up a relatively conductive deposit at the negative electrode, which deposits are not dissipated at the cessation of reset current flow. This accumulation of tellurium at the positive electrode and germanium at the negative electrode, in effect reduces the thickness of the armorphous high resistance composition of tellurium, germanium and other elements between the accumulation of these deposits. As indicated, the accumulation of these elements at the positive and negative electrodes is opposed after resetting of the memory semiconductor material by diffusion of the materials in the opposite direction to the electromigration to produce a progressively decreasing concentration gradient of these elements. The build up of the tellurium and germanium deposits ceases when equilibrium is reached between electromigration of the elements involved in one direction and diffusion thereof in the opposite direction. The degradation of threshold voltage does not occur when these generally bilateral memory devices are operated with reset pulses which alternate in polarity, because then there is no net migration of the elements involved which tend to build up under the much different D.C. resetting conditions described.

The threshold degradation problem described is one which applied also to memory semiconductor devices having crystalline filaments in their low resistance states and compositions other than those exemplified by the aforesaid formula. However, the above mentioned threshold degradation is not observed in D.C. operated non-memory threshold devices like those described in U.S. Pat. No. 3,271,591, as mechanism devices, where a resetting of the devices is achieved by lowering the current therethrough below a given holding current value. The very modest current conditions during the reading or setting of non-memory threshold devices or memory devices are not believed to cause any significant electromigration. (For example, typical reset currents of memory devices are of the order of magnitude of 150 ma whereas typical read and set currents for these devices and non-memory threshold devices are well under 10 ma.)

The aforementioned short term failure of memory devices where the electrode-semiconductor interface region is damaged is also believed to be a result of the presence of high value reset currents flowing in the under 10 microns width filaments formed in filament-type memory semiconductor devices.

SUMMARY OF THE INVENTION

In accordance with one of the aspects of the present invention, I discovered that stabilation of the threshold voltage of a filament-type memory device may be achieved after a relatively few number of set and reset cycles if during the fabrication of these devices there is provided by at least at one of the electrodes an electrode-semiconductor interface region with a substantial enrichment (i.e. high concentration) of the element which would otherwise migrate to the electrode during flow of reset current through the semiconductor material filament being reset. Thus, in the example of a germanium-tellurium memory semiconductor composition, a region of tellurium is provided of a much higher concentration than in the amorphous composition of the semiconductor material adjacent the positive electrode at least at the point where the crystalline tellurium filament path of the semiconductor material terminates. It is believed that such an electrode-semiconductor material element enriched interface region reduces or eliminates electromigration during the flow of reset current, and diffusion of the enriching element to produce a stabilized equilibrium condition rapidly occurs within relatively few set-reset cycles. It was also strangely discovered that this rapid threshold stabilization occurs even when both electrodes are enriched with the same element. However, there is no threshold stabilization when only one of the terminal points of the filament which receives reset current is enriched by the element which does not migrate thereto as, for example, by enriching the region of the semiconductor material adjacent the positive electrode with germanium in the exemplary semiconductor composition referred to.

In accordance with the invention, the stabilization of the threshold voltage at a desired value can be achieved during fabrication of the device upon a matrix substrate or other substrate, for example, by sputter depositing a desired amount of tellurium on the face of the semiconductor material at which the positive electrode is to be subsequently applied, and after completion of the device alternately setting and resetting the device by appropriate set and reset pulses. In one example, with a 0.7 micron thick sputter deposited film of crystalline tellurium on a 1.5 micron thick layer of the exemplary composition described above, substantial stabilization of the threshold voltage at 11.5 volts was achieved in about 10 set-reset cycles, where the set signal was a single 10 millisecond wide flat top current pulse of 7.5 milliamps (1 millisecond rise time, 5 milliseconds fall time) and each reset signal was a succession of 8, 6 microsecond 150 milliamp pulses spaced 100 microseconds apart. (The reset current pulses may be obtained from a constant current source.) The repetition rate of the set-reset cycles was 20 cycles per second after the first 100 cycles.

The electrode which had positive set and reset signals applied thereto heretofore comprised an outer layer of aluminum and an inner layer of a barrier-forming material, which was generally a refractory metal like amorphous molybdenum, which prevented migration of aluminum into the memory semiconductor material (which migration would destroy the electrical qualities thereof by rendering the same continuously conductive). Thus, the enriched region of tellurium in the example given was located adjacent a molybdenum inner electrode layer, which previously provided the suitable low resistance contact between the aluminum and the memory semiconductor material.

While such a result was not sought or anticipated, the use of the aforesaid element enriched electrode-semiconductor material interface region substantially lowered the contact resistance of the memory device and hence the "on" read voltage, and reduced the variation in the "on" read voltage between supposedly identically made memory devices (and also reduced substantially the variation from cycle to cycle in the "on" read voltage of the same device); when the enriched region extended across substantially the entire surface area of the memory semiconductive material involved. Also, the voltage measurements during readout and during the application of the set pulses contained less noise components with the use of the element enriched region referred to.

In the application of the present invention to sandwich type memory devices, such as those integrated into a silicon chip (where the memory device comprises vertically stacked layers of electrode and memory semiconductor-forming materials), the invention is most conveniently carried out by placing the enriched tellurium region at the outermost surface of the memory semiconductor material, that is nearest the outer deposited electrode. The application of an enriched region at the inner surface of the memory semiconductor material creates an additional fabrication step to avoid short circuiting problems for reasons to be explained later on in the specification.

While tellurium contacting layers have heretofore been utilized in various types of semiconductor devices, such uses involve environments much different from that of the present invention so that there was no teaching of the use of tellurium enriched regions in D.C. operated filament type memory devices of sufficient concentration or thickness to effect a rapid threshold stabilization and where such devices have low resistance contact electrodes. Examples of prior uses of tellurium electrode layers for semiconductor devices include U.S. Pat. No. 3,271,591 to S. R. Ovshinsky, which is owned by the assignee of the present invention, Energy Conversion Devices, Inc. and U.S. Pat. Nos. 2,869,057, 2,822,299, 2,822,298, 3,480,843 and 3,432,729. In these prior uses of tellurium as electrodes, it appears that the tellurium serves as an active element of the device, such as a layer of p-n junction, or an electrodes analogous to the barrier-forming molybdenum electrodes. In contrast, it should be repeated that my tellurium enriched regions are used principally in filament type D.C. signal operated devices mainly for threshold voltage stabilization and frequently with barrier-forming electrodes like molybdenum.

With regard to the short term failure of memory semiconductor devices used in the matrices described, my investigation of the causes of the failure was the great stresses imparted to the molybdenum barrier-forming layer by the heat developed by the large reset currents flowing through the small filamentous path, added to the initial stresses in the layer. The resultant stresses caused the molybdenum layer to bulge and/or crack and lose good contact with the semiconductor material. These stresses are reduced by applying initially almost stress-free molybdenum layers, and with aluminum or other highly conductive metal layers to form a good heat sink. Molybdenum layers can be deposited in a substantially stress-free state when deposited as very thin films, such as 0.15 microns or less (while typically for ideal barrier-forming functions deposits of 0.23 microns and greater have generally been heretofore used). It is difficult to deposit molybdenum in such greater thicknesses without creating initially high stresses in the molybdenum because of its low coefficient of expansion in comparison to the materials to which they are adhered.

While aluminum thicknesses of 1-1.5 microns are typical for memory devices, thicknesses of at least 1.75 microns and preferably 2.0 microns are most desirable to eliminate cracking or bulging of the molybdenum (or other refractory metal) barrier-forming electrodes. While there may have been references to ranges of thickness of aluminum electrode layers which include the desired thicknesses thereof described (e.g. see U.S. Pat. No. 3,699,543), there was no teaching therein of the importance of the combination of stress-free molybdenum inner barrier-forming electrode layers (which could be thick films if some way were developed to deposit desirably thick but stress-free films) combined with unusually thick outer electrode layers.

DESCRIPTION OF THE DRAWINGS

FIG. 1 illustrates a typical generalized form of a filament current path-forming memory device with the electrodes thereof connected to a switching circuit for switching set, reset and readout voltages thereto, the figure also indicating the filamentous path in the semiconductor material of the memory device in which current flows in the low resistance condition thereof;

FIGS. 2A and 2B illustrate various applied voltage and resulting current flow conditions of the memory device of FIG. 1 under the set, reset and low resistance readout modes of operation of the memory device;

FIG. 6 illustrates the memory device of FIG. 1 where the substrate is a silicon chip and the device forms part of an x-y memory matrix system including various switching means and voltage sources for setting, resetting and reading out the resistance conditions of a selected memory device of the matrix; and FIG. 7 shows curves illustrating the effect of the presence and absence of the tellurium enriched interface region between the positive or negative electrode and the active semiconductor material of a memory device on the variation of threshold voltage of an initially fabricated memory device with the number of set and reset cycles applied thereto.

DESCRIPTION OF PRIOR ART AND PREFERRED EMBODIMENT OF THE INVENTION

Figure 3:
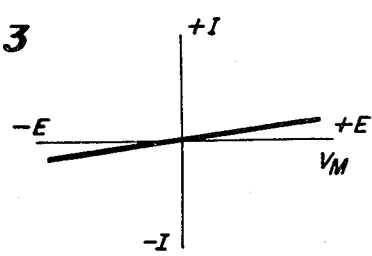
FIGS. 3 and 4 respectively illustrate the voltage-current characteristics of the memory device of FIG. 1 respectively in the high and low resistance conditions thereof.

Referring now more particularly to FIG. 1, there is shown in this figure a fragmentary portion of a filament current path-forming memory device generally indicated by reference numeral 1. As heretofore more commonly constructed, a memory device of this type generally included a series of superimposed sputter deposited films upon a substrate 2 which, in the case of a memory matrix, was the exposed portion of a silicon chip substrate, and in the case of discrete devices would most likely be a substrate of a suitable insulation material. Deposited as a first coating upon the substrate 2 is an electrode 4 upon which is preferably sputter deposited an active memory semiconductor material layer 6. The interface between the electrode 4 and the memory semiconductor layer 6 makes an ohmic contact (rather than a rectifying or contact generally associated with p-n junction devices). The memory semiconductor layer 6, as previously indicated, is most preferably a chalcogenide material having as major elements thereof tellurium and germanium, although the actual composition of the memory semiconductor material useful for the memory semiconductor layer 6 can vary widely in accordance with the broader aspects of the invention.

Preferably sputter deposited on the memory semiconductor layer 6 is an outer electrode generally indicated by reference numeral 8. The outer electrode 8 generally comprises an inner barrier-forming layer 8a of an ohmic contact-forming refractory metal like molybdenum, preferably amorphous molybdenum, which is sputter deposited upon the memory semiconductor layer 6, and a more highly conductive outer layer 8b of aluminum or other highly conductive metal, such as copper, gold, silver. When the outer electrode 8 shown in FIG. 1 is positive with respect to the inner electrode 4, without the barrier-forming layer 8a there would or could be a migration of the aluminum or other highly conductive metal, which would render the same permanently conductive and destroy the desired electrical switching characteristics thereof.

A conductor is shown interconnecting the outer electrode layer 8b to a switching circuit 12 which can selectively connect the positive terminal of a set voltage pulse source 14, a reset voltage pulse source 16, or a readout voltage source 20 to the outer electrode. The inner or bottom electrode 4 of the memory device 1 and the other terminals of the various voltage sources described are all shown connected to ground. In the connection between the switching circuit 12 and the set voltage source 14 is shown a current limiting resistor 13, and in the connection between the switching circuit 12 and the positive terminal the readout voltage source 20 is shown a voltage divider resistor 18. The reset voltage pulse source 16 is a very low resistance source so when the memory device 12 is in a low resistance condition and a reset voltage pulse is applied to the memory device by the reset voltage source a relatively high amplitude reset current pulse (e.g. 150 milliamps) flows therethrough. (The reset voltage pulse source 16 may be a constant current source.)

Exemplary outputs of the voltage sources 14, 16 and 20 are illustrated in FIG. 2A and the exemplary currents produced thereby are illustrated in FIG. 2B below the corresponding voltage pulses involved. As thereshown, the voltage output of the set voltage source 14 will be in excess of the threshold voltage value of the memory device 1, whereas the amplitude of the output of the readout voltage source 20 must be less than the threshold voltage value of the memory device 1. For a set voltage pulse to be most effective in setting the memory device 1 from an initial high resistance to a low resistance conditions, a generally long duration pulse waveform is required having a duration in milliseconds as previously described. A readout pulse can, if desired, be a wide or short pulse. However, the reset pulse is generally such a very short duration pulse measured in microseconds rather than milliseconds that it cannot set the memory device even if its amplitude exceeded the threshold voltage value of the memory device. (It is assumed that the high resistance condition of the memory device is so much higher than any impedance in series therewith that one can assume that substantially the entire applied voltage appears thereacross.)

In the reset state of the memory device 1, the memory semiconductor layer 6 thereof is an amorphous material throughout, and acts substantially as an insulator so that the memory device is in a very high resistance condition. However, when a set voltage pulse is applied across its electrode 4 and 8 which exceeds the threshold voltage value of the memory device, current starts to flow in a filamentous path 6a in the amorphous semiconductor layer 6 thereof which path is believed to be heated above its glass transition temperature. The filamentous path 6a is generally under 10 microns in diameter, the exact diameter thereof depending upon the value of the current flow involved. The current resulting from the application of the set voltage pulse source may be under 10 milliamps. Upon termination of the set voltage pulse 14, because of what is believed to be the bulk heating of the filamentous path 6a and the surrounding material due to the relatively long duration current pulse, and the nature of the crystallizable amorphous composition of the layer 6, such as the germanium-tellurium compositions described, one or more of the composition elements, mainly tellurium in the exemplary composition, crystallizes in the filamentous path. This crystallized material provides a low resistance current path so that upon subsequent applicatiaon of the readout voltage from the source 20 current will readily flow through the filamentous path 6a of the memory device 1 and the voltage across the electrodes of the memory device becomes a factor of the relative value of the memory device resistance and the voltage divider resistor 18 in series therewith.

The high or low resistance condition of the memory device 1 can be determined in a number of ways, such as by connecting a voltage sensing circuit between the electrodes 8 of the memory device 1, or, as illustrated, by providing a current transformer 23 or the like in the line extending from the readout voltage source 20 and providing a condition sensing circuit 22 for sensing the magnitude of the voltage generated in the transformer output. If the device 1 is in its set low resistance condition, the condition sensing circuit 22 will sense a relatively low voltage and when the device 1 is in its reset high resistance condition it will sense a relatively large voltage. The current which generally flows through the filamentous path 6a of the memory device 1 during the application of a readout voltage pulse is of a very modest level, such as 1 milliamp.

Figure 4:
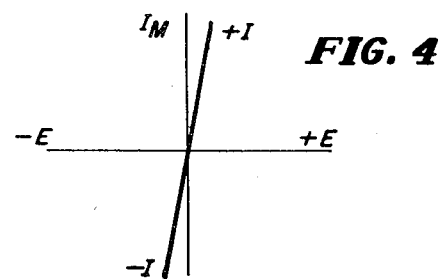

FIG. 3 shows the variation in current flow through the memory device 1 with the variation in applied voltage when the memory device is in its relatively high resistance reset condition and FIG. 4 illustrates the variation in current with the variation in voltage applied across the electrodes 4 and 8 thereof when the memory device is in its relatively low resistance set condition.

As previously indicated, the present invention solves a threshold degradation problem occurring because of a repeated resetting of the memory device 1. Each resetting of the filamentous path 6a of the memory semiconductor layer 6 from its low back to its high resistance condition is effected by one or more relatively high current reset pulses applied thereto by the connection of the reset voltage source 16 in the memory device 1. In such case, the high reset current is believed to heat at least parts of the crystalline filamentous path 6c to temperatures which melts the same and dissipates the state of the previously crystalline element or elements thereof. Upon a quick termination of a reset current pulse, where bulk heating affects are minimized, the previously melted portions of the filamentous path solidify into an amorphous composition of the elements involved. It has been discovered by one other than the inventor of the present invention that to ensure a substantially complete homogenization of the material within the filamentous path 6a, a succession of reset pulses should be fed to the memory device during each reset operation most if not all of which are generated by reset voltage pulses in excess of the threshold voltage value of the memory device.

Once a crystalline path has been established in the memory device 1, however, it is believed even after a substantially complete resetting operation there generally remains a few widely spaced areas of crystalline material in the original current path 6a, which conditions the device to have its subsequent current path follow the originally established current path 6a. In any event, as previously explained, before equilibrium conditions are established during each flow of reset current in the filamentous path 6a, there is progressively built up by an electromigration process in the case of the exemplary germanium-tellurium semiconductor composition described a highly conductive crystalline tellurium deposit at the positive electrode 8 and a deposit of conductive germanium adjacent the negative electrode 4. This reduces the thickness of the amorphous portion of the reset filamentous path 6a, thereby progressively reducing the threshold voltage value of the memory device in inverse proportion to the thicknesses of these tellurium and germanium deposits.

Figure 5:
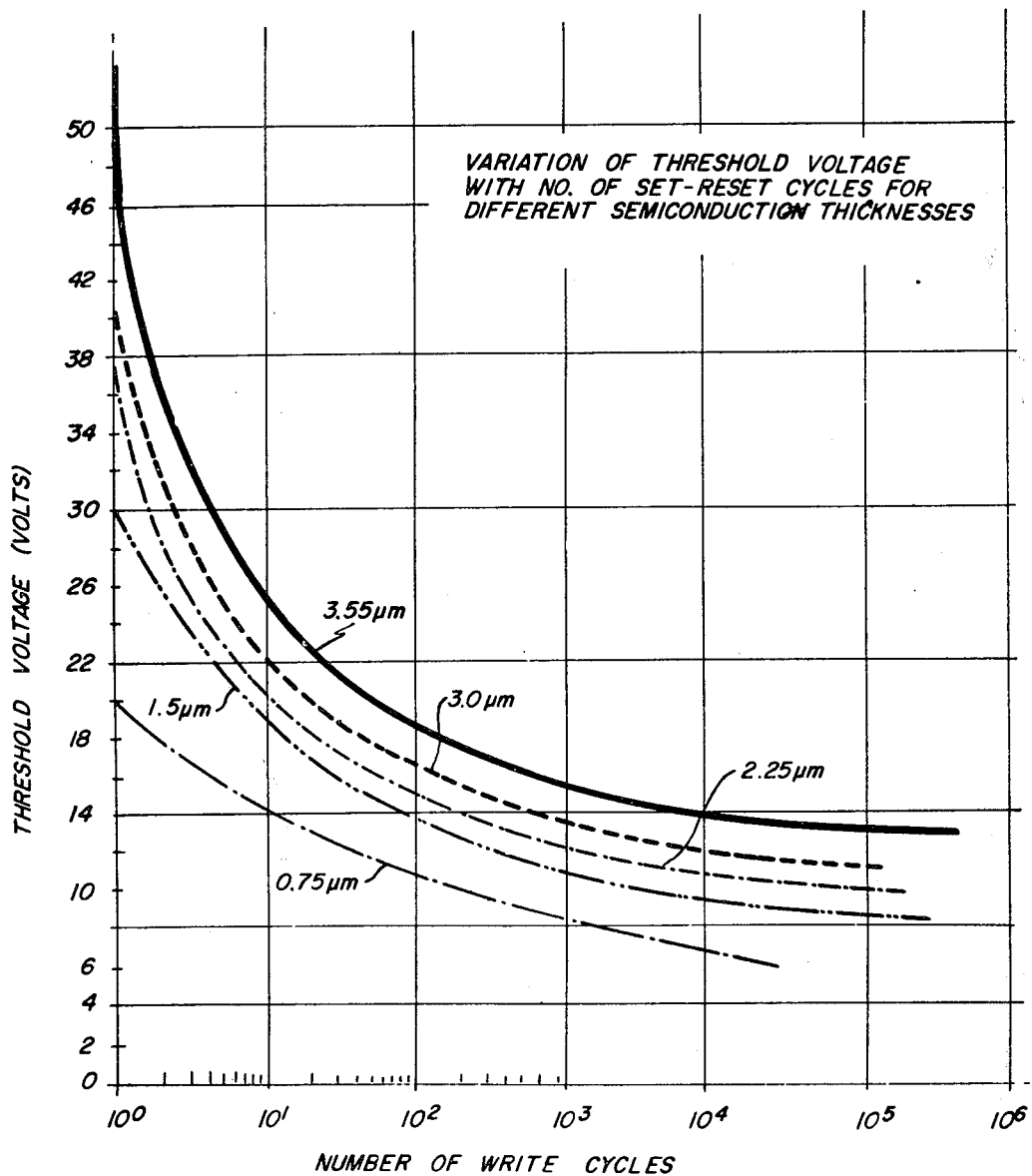
FIG. 5 illustrates curves showing the variation in threshold voltage of an initially fabricated memory device for various memory semiconductor material thicknesses of such devices, as the number of set and reset cycles applied thereto are increased in number, the curves illustrating the problem of threshold degradation with which the present invention deals.

FIG. 5 illustrates the problem of degradation of threshold voltage from the time the memory device is initially fabricated, for various thicknesses of the memory semiconductor layer 6 in the particular test memory devices from which these curves were made. It can be seen that it was discovered that the threshold voltage values for the various thicknesses of memory semiconductor layers stabilize or level out at various values in proportion to the thickness of the memory semiconductor layer 6. As previously indicated, this stabilization is believed due to the diffusion of part of the tellurium and germanium deposits at the electrodes 8 and 4 into the amorphous body of the semiconductor layer during and after each reset operation. Equilibrium eventually occurs between the electromigration and diffusion processes which terminates the build up of the tellurium and germanium deposits at the electrodes 8 and 4. This state of equilibrium requires in the memory device 1 an exceedingly large number of set-reset cycles (such as tens and hundreds of thousands as shown in FIG. 5). A modification in the construction of the memory device 1 as illustrated in FIG. 6 reduces the number of set-reset cycles to stabilize the threshold voltage to a relatively small number so that it can be quickly and easily achieved during fabrication of the devices. Thus, when the customers receive memory devices made in accordance with the present invention, threshold voltages are already stabilized and he can rely on the specified threshold voltage values of the devices for the reference temperature involved.

FIG. 6 shows an entire memory device 1' integrated upon a silicon chip substrate generally indicated by reference numeral 2'. (The various corresponding portions of the memory device 1' and memory device 1 previously described are shown by corresponding reference numerals with a prime (') added to the elements in FIG. 6). The memory device 1' may form part of an x-y memory matrix, such as disclosed in U.S. Pat. No. 3,699,543, and, in such case, the x or y axis conductors are built into the body of the silicon chip substrate 2'. One of these x or y axis conductors is indicated by a n plus region 26 in the substrate 2' which region is immediately beneath a n region 28, in turn, immediately beneath a p region 30. The p-n regions 30 and 28 of the silicon chip 2' form a rectifier which, together with the memory device 1', are connected between one of the crossover points of the x-y matrix involved. Such a rectifier requires for current flow that the outer electrode 8' of the memory device 1 be the positive electrode.

The silicon chip 2' generally has applied thereto a film 2a' of an insulating material, such as silicon dioxide. This silicon dioxide film is provided with openings like 24 each of which initially expose the semiconductor material of the silicon chip above which point a memory device 1' is to be located. A suitable electrode layer 4' is selectively deposited over each exposed portion of the silicon chip, which layer may be palladium silicide or other suitable electrode-forming material. The memory semiconductor layer 6' of each memory device 1' is preferably sputter deposited over the entire insulating film 2a' and is then etched away through a photo-resist mask to leave separated areas thereof centered over the openings 24 in the insulating film where the memory semiconductor material extends into the openings 24.

In accordance with the most important feature of the present invention, threshold stabilization can be obtained in a relatively few number of set and reset cycles by forming in the interface region between the refractory metal barrier-forming electrode layer 8a' and the memory semiconductor layer 6' an enriched region of the element which would normally migrate towards the adjacent electrode, namely in the tellurium-germanium composition involved an enriched area of tellurium. By an enriched region of tellurium is meant tellurium in much greater concentration than such tellurium is found in the semiconductor composition involved. This can be best achieved by sputter depositing a layer 32 of crystalline tellurium upon the entire outer surface of the memory semiconductor layer 6'. Over this tellurium layer 32 is deposited the barrier-forming refractory metal layer 8a' and the outer highly conductive metal electrode layer 8b'.

With the application of a tellurium layer of sufficient thickness (a 0.7 micron thickness layer of such tellurium was satisfactory in one exemplary embodiment of the invention where the memory semiconductor layer 6' was 1.5 microns thick), the threshold voltage versus number of set-reset cycle curve may be that shown in FIG. 7 by curve 34. It will be noted that substantial equilibrium in the threshold voltage value is achieved after little more than 10 set-reset cycles. By comparison, curve 36 illustrates the inferior threshold voltage value degradation curve in the absence of the tellurium layer 32 and the curve 38 illustrates the inferior threshold degradation curve when the tellurium layer 32 is only adjacent a negative rather than a positive electrode.

If a tellurium enriched region is applied opposite both positive and negative electrodes, the advantages of the invention are still achieved because there is an enriched area adjacent at least one of the electrodes of the element which would normally migrate there. It is not known, however, whether the reasons for threshold stabilization in such case are the same as where the tellurium layer is placed opposite only the positive electrode 8. However, in accordance with present technology, it requires an additional step in fabrication to apply a tellurium enriched region above the inner electrode layer 4 in a manner to avoid a short circuit. Thus, it is necessary to limit the area of tellurium deposition over the layer 4' only to the area of the silicon dioxide film opening 24 since if such a tellurium layer were to extend over the silicon dioxide film, the layers 8a' and 8b' extending around the outer edges of the memory semiconductor layer 6' would contact the bottommost tellurium enriched region to short circuit the memory semiconductor layer 6'. This can be done by an etching operation performed through a photo-resist mask. When the tellurium enriched region is applied over the memory semiconductor layer, the same etching operation is used to etch away the successively applied memory semiconductor and tellurium enriched layers to leave small separated areas thereof opposite each opening 24.

As previously indicated, threshold voltage values are obviously stabilized at a value much higher than the marginal threshold voltage for a particular memory system. Thus, as previously explained, a memory device having an 8 volt threshold at room temperature will have a threshold voltage of about 5 volts in the vicinity of 100°C. In such case, to provide a factor of safety, it is desirable to stabilize the threshold voltage value of the device at a point significantly greater than the 8 volt marginal room ambient temperature value. In FIG. 7, it is noted that the particular memory device involved has its threshold voltage stabilized at about 11 volts, which gives an adequate factor of safety. To achieve a threshold voltage stabilization of such a value requires a memory semiconductor layer 6' of appropriate thickness, since the stabilization point is a function of the memory semiconductor thicknesses, as illustrated by FIG. 5.

It should be noted that the tellurium region or layer 32 most advantageously extends opposite substantially the entire outer surface area of the memory semiconductor layer 6' and the inner surface area of the barrier-forming refractory metal layer 8a' so the tellurium region will be located at the termination of the filamentous path 6a' no matter where it is formed and so it makes an extensive low resistance contact with the refractory metal layer 8a'. The tellurium layer unexpectedly lowers the overall resistance of the memory device 1' in the conductive state thereof. It acts as an especially good material to distribute current emanating from the small filamentous path 6a' provided it contacts a substantial portion of the refractory metal. One would expect that the overall resistance would not be lowered by the addition of the tellurium layer 32 since the resistance of the refractory metal layer 8a' is still in series with the outer electrode layer 8b'.

Another aspect of the invention is the elimintion of short term failure due previously to the bulging or cracking of the outer barrier-forming refractory metal layer. In the memory device 1', the great mass of the substrate readily dissipates heat build up in the region where the filamentous path 6a' terminates at the palladium silicide electrode 4'. As previously explained, it was discovered that bulging or cracking of the refractory metal electrode under the stresses of the high resets current flowing through the memory device is eliminated by depositing the refractory metal layer in a relatively stress-free condition (which can be easily achieved by utilizing very thin sputter deposited films which are of the order of magnitude of 0.15 microns or less rather than the more typical 0.23 microns or greater) and also by utilizing a thicker than usual outer electrode layer 8b', such a layer of at least about 1.75 microns thick when aluminum is the material out of which it is made. Where better heat dissipating materials like copper, gold or silver is utilized for the outer electrode layer 8b' thinner layers can be used to provide a good heat sink.

In the x-y matrix embodiment of the invention, the outer electrode layer 8b' of aluminum or the like of each memory device in the matrix connects to a deposited row or column conductor 33 deposited on the insulating layer 2a'. The n plus regions like 26 of the substrate 2' form a column or row conductor of the matrix extending at right angles to the row or column conductor 33. Each row or column conductor like 33 of the matrix to which the outer electrode layer 8b of each memory device 1 is connected is coupled to one of the output terminals of a switching circuit 12 having separate inputs extending respectively directly or indirectly to one of the respective output terminals of the set, reset and readout voltage sources 14, 16 and 20. The other terminals of these voltage sources may be connected to separate inputs of a switching circuit 12'' whose outputs are connected to the various $n$ plus regions like 26 of the matrix. The switching circuits 12' and 12'' effectively connect one of the selected voltage sources 14, 16 or 20 to a selected row and column conductor of the matrix, to apply the voltage involved to the memory device connected at the crossover point of the selected row and column conductors.

The present invention has thus materially improved the short and long term reliability of memory devices of the filament type and has resulted in a marked improvement in the utility of memory devices of the type described.

It should be understood that numerous modifications may be made in the most preferred forms of the invention described without deviating from the broader aspects of the invention.

I claim:

1. A method of quickly stabilizing the threshold voltage of a memory semiconductor switch device to be used in a D.C. circuit and which includes a pair of spaced electrodes between which extends a body of high resistance amorphous memory semiconductor material of a composition which when one of more D.C. voltage set pulses are applied to said electrode there results current flow through a filamentous path in said semiconductor material termination of the voltage pulse or pulses resulting in a crystalline relatively low resistance deposit of at least one of said elements in said path, and wherein application of one or more D.C. current reset pulses of a given amplitude to said filamentous path will substantially return said filamentous path to a generally amorphous condition, and during the flow of said reset current pulses through said filamentous path there normally occurs migration of the relatively electropositive element of said composition to the negative electrode and migration of the relatively electronegative element to the positive electrode, said method comprising the steps of applying during the fabrication of the device adjacent at least one of said electrodes at the location where said filamentous path will terminate an element enriching region containing one of said elements there being in said element enriching region a greater concentration of said element than in said composition of memory semiconductor material, and said element enriching region being sufficiently thick and having a sufficient concentration of said element to effect a stabilized gradient of said element through the reset region of the semiconductor material in at most a small number of set-reset cycles, so that threshold voltage stabilization is quickly achieved.

2. The method of claim 1 wherein the completed device is subjected to said threshold voltage stabilizing set-reset cycle before the device is shipped to the user thereof.

3. The method of claim 1 wherein said element enriching region is applied to the area of the memory semiconductor material adjacent only one of said electrodes.

4. A method of stabilizing the threshold voltage of a memory semiconductor conductor switch device to be used in a D.C. circuit and which includes a pair of spaced electrodes between which extends a body of high resistance amorphous memory semiconductor material of a composition which when a D.C. voltage pulse in excess of a given threshold level is supplied to said electrodes for a given period results in current flow through a filamentous path, termination of the voltage pulse of said given period resulting in a crystalline relatively low resistance deposit of at least one of said elements, and wherein one or more D.C. current reset pulses of a given amplitude applied to said filamentous path will substantially return said filamentous path to a generally amorphous condition, and during the flow of said reset current pulses through said filamentous path there being migration of the relatively electropositive element of said composition migrating to the negative electrode and the migration of the relatively electronegative element to the positive electrode, and at least one of said electrodes of the device comprising an outer layer of highly conductive material which normally would migrate into said memory semiconductor material when a voltage of a given polarity is applied thereto and an inner barrier-forming layer which inhibits the migration of said highly conductive material into said memory semiconductor material, said method comprising the steps of applying during the fabrication of the device an electrode-memory semiconductor interface region containing one of said elements adjacent at least one of said electrodes at the location where said filamentous path will terminate, there being in said electrode-memory semiconductor interface region a greater concentration of said element than in said composition of memory semiconductor material, and said electrode-memory semiconductor interface region being sufficiently thick and having a sufficient concentration of said element to effect a stabilized gradient of said element through the reset region of the semiconductor material in at most a small number of set-reset cycles, so that threshold voltage stabilization is quickly achieved.

5. The method of claim 4 wherein the completed device is subject to said threshold voltage stabilizing set-reset cycle before the device is shipped to the user thereof.

6. The method of claim 4 wherein said inner barrier-forming layer and outer layer of highly conductive material is adjacent to said electrode-memory semiconductor interface region.

* * * * *